(12) United States Patent  (10) Patent No.: US 8,357,906 B2
Hanfoug  (45) Date of Patent: Jan. 22, 2013

(54) LITHOGRAPHY SYSTEM, SENSOR, CONVERTER ELEMENT AND METHOD OF MANUFACTURE

(75) Inventor: Rabah Hanfoug, Gouda (NL)

(73) Assignee: Mapper Lithopraphy IP B.V., Delft (NL)

( * ) Notice: Subject to any disclaimer, the term of this patent is extended or adjusted under 35 U.S.C. 154(b) by 52 days.

(21) Appl. No.: 13/053,488

(22) Filed: Mar. 22, 2011

(65) Prior Publication Data

US 2011/0253900 A1   Oct. 20, 2011

(30) Foreign Application Priority Data

Mar. 22, 2010 (NL) ..................................... 1037820

(51) Int. Cl.
*G21K 5/10* (2006.01)
(52) U.S. Cl. .... 250/369; 250/397; 438/56; 257/E31.001
(58) Field of Classification Search .................... 250/369
See application file for complete search history.

(56) References Cited

U.S. PATENT DOCUMENTS

| 4,814,615 | A | * | 3/1989 | Fushimi et al. | ............... | 250/311 |
| 5,892,230 | A | * | 4/1999 | Goodberlet et al. | ...... | 250/361 R |
| 6,496,665 | B2 | * | 12/2002 | Umezawa et al. | ............. | 399/67 |
| 6,791,094 | B1 | * | 9/2004 | Olson et al. | .................... | 250/397 |
| 2004/0119024 | A1 | * | 6/2004 | Avnery | .......................... | 250/397 |
| 2004/0135983 | A1 | | 7/2004 | Wieland | | |
| 2007/0057204 | A1 | | 3/2007 | Kruit | | |

FOREIGN PATENT DOCUMENTS

EP   1505630 A2 * 2/2005

OTHER PUBLICATIONS

X-Ray masks with tungsten absorbers for use in the LIGA process, Microelectronic Engineering part 21, nr. 1-4 Apr. 1, 1993, K. Kadel et al.
Paper L7.2 Thin film fracture during nanoindentation of hard film-soft substrate systems, Materials Research Society Symposium—proceedings 2002, part 695, Nov. 26, 2001. Pang, M et al.
Search report for priority application NL 1037820 dated Nov. 12, 2010.
International Search Report from PCT/EP2011/054372 dated May 10, 2011.

* cited by examiner

*Primary Examiner* — Marcus Taningco
(74) *Attorney, Agent, or Firm* — Hoyng Monegier LLP; David P. Owen; Coraline J. Haitjema

(57) ABSTRACT

Charged particle beamlet lithography system for transferring a pattern to a surface of a target comprising a sensor for determining one or more characteristics of one or more charged particle beamlets. The sensor comprises a converter element for receiving charged particles and generating photons in response. The converter element comprises a surface for receiving one or more charged particle beamlets, the surface being provided with one or more cells for evaluating one or more individual beamlets. Each cell comprises a predetermined blocking pattern of one or more charged particle blocking structures forming multiple knife edges at transitions between blocking and non-blocking regions along a predetermined beamlet scan trajectory over the converter element surface. The converter element surface is covered with a coating layer substantially permeable for said charged particles and substantially impermeable for ambient light. An electrically conductive layer is located between the coating layer and the blocking structures.

23 Claims, 3 Drawing Sheets

LITHOGRAPHY SYSTEM, SENSOR, CONVERTER ELEMENT AND METHOD OF MANUFACTURE

BACKGROUND OF THE INVENTION

1. Field of the Invention

The present invention relates to a charged particle lithography system, in particular to a maskless charged particle system, to a sensor therefore, in particular for determining charged particle beam properties, to a converter element therefore, as well as to a method of manufacturing the same.

2. Description of the Related Art

Charged-particle beamlet lithography systems make use of a plurality of charged particle beamlets to transfer a pattern onto the surface of a target. The beamlets may write the pattern by being scanned over the target surface while their trajectory may be controllably blocked so as to create a beamlet that can be turned on or off. Blocking may be established by electrostatic deflection of beamlets on a blocking surface. Additionally, or alternatively, the size and shape of the beamlets may be adapted along the trajectory. Deflection, shaping and/or size adaptation may be executed by one or more electron optical components like for example an aperture array, an array of electrostatic deflectors and/or beamlet blankers. In order to transfer a pattern onto the target surface, the controllable blocking of beamlets in combination with their movement over the target surface is performed in accordance with modulation information. An example of a multiple charged-particle beamlet lithography system is described in U.S. Pat. No. 6,958,804, which disclosure is herewith incorporated by reference in its entirety.

Such lithography systems can have very large numbers of beamlets, i.e. in the order of 10,000 or higher, for example 13,000. Future designs even envisage numbers in the order of 1,000,000 beamlets. It is a general aim for current electron beam lithography systems to be able to pattern a target surface in high-resolution, with some applications being capable of imaging patterns with a critical dimension of well below 100 nm feature sizes.

For such multiple beamlet, high-resolution lithography systems to be commercially viable it is important that the position of each one of the charged particle beamlets is precisely known and controlled. Additionally, knowledge and control of spot size and shape and intensity of the beamlets at the target surface are also of importance. Due to various circumstances, such as manufacturing tolerances and thermal drift, such beamlet characteristics may however deviate from their expected and desired characteristics, which may render these deviating beamlets invalid for accurate patterning.

Such deviations may include, among other things, a deviation in position, a deviation in spot size as exposed on the target surface and/or a deviation in beamlet intensity. Deviating beamlets may severely affect the quality of the pattern to be written. It is therefore desirable to detect these deviations so that corrective measures may be taken.

In conventional lithography systems, the position of each beamlet is determined by frequent measurement of the beamlet position. With knowledge of the beamlet position the beamlet can be shifted to the correct position. For accurate writing it is beneficial to determine the beamlet position within a distance in the order of a few nanometers.

Known beamlet position calibration methods generally comprise at least three steps: a measuring step in which the position of the beamlet is measured, a calculating step in which the measured position of the beamlet is compared to the desired expected position of that beamlet, and a compensation step in which the difference between the measured position and the desired position is compensated for. Compensation may be performed either in the software or in the hardware of the lithography system.

In advanced charged particle beamlet lithography systems, besides position control, beamlet spot size control may be of equal importance. Desired specifications for spot size measurements include determination of beamlet spot sizes in the range of 30 nm to 150 nm; accuracy of spot size measurements with 3 sigma value smaller than 5 nm; and a reproducibility of such spot size measurements within a single sensor with 3 sigma value smaller than 5 nm.

It is desirable to determine characteristics like beamlet position and/or beamlet spot size during operation of a lithography system to allow for early position and/or spot size calibration to improve the target surface patterning accuracy. In order to limit negative effects on throughput, i.e. the number of target surfaces that can be patterned within a predetermined period of time, it is desirable that the method of measuring the characteristics of the charged particle beamlets can be carried out within a limited period of time without sacrificing accuracy.

A sensor for measuring properties of a large number of charged-particle beamlets, in particular for charged particle beamlets used in a lithography system, is described in US published patent application 2007/057204 assigned to the present applicant, the content of which is herewith incorporated by reference in its entirety.

US 2007/057204 describes a sensor and method in which charged-particle beamlets are converted into light beams, using a converter element such as a fluorescent screen or a doped YAG material. Subsequently, the light beams are detected by an array of light sensitive detectors such as diodes, CCD or CMOS devices. A relatively fast measurement can be achieved by reading out a large number of light sensitive detectors in a single operation. Additionally the sensor structure, in particular the array of light detectors, enables a very small pitch of a multiplicity of beams to be measured without the necessity of unduly large structural measures in the region of the stage part of a lithography system.

However, in view of the continuously increasing demands of the industry regarding small dimensions without loss of throughput, there remains a need to provide even more accurate devices and techniques for measurement of beamlet properties in lithography systems, particularly in lithography machines comprising a large number of charged-particle beamlets that are designed to offer a high throughput.

BRIEF SUMMARY OF THE INVENTION

It is an object of the present invention to provide a more accurate sensor is suitable for use in a charged particle lithography system with enhanced resolution performance. For this purpose, the present invention provides a charged particle beamlet lithography system for transferring a pattern to a surface of a target comprising a sensor for determining one or more characteristics of one or more charged particle beamlets, the sensor comprising a converter element for receiving charged particles and generating photons in response, the converter element comprising a surface for receiving one or more charged particle beamlets, the surface being provided with one or more cells for evaluating one or more individual beamlets, each cell comprising a predetermined blocking pattern of one or more charged particle blocking structures forming multiple knife edges at transitions between blocking and non-blocking regions along a predetermined beamlet scan trajectory over the converter element surface, wherein the converter element surface is covered with a coating layer substantially permeable for the charged particles and substantially impermeable for ambient light, and wherein the sensor further comprises an electrically conductive layer between the coating layer and the blocking structures.

The coating layer allows the sensor to respond in a more uniform manner to the receipt of charged particles over a considerable area of the converter element surface, for example over an area of about 3×3 mm². The coating layer removes local influences from ambient light, for example background radiation or the like. As a result, a plurality of beamlets may be sensed simultaneously with high resolution. Suitable materials for use in the coating layer include titanium (Ti) and aluminum (Al).

The blocking structures generally comprise a heavy metal like tungsten (W), and providing such structures on top of a substrate generally includes one or more etching steps. The material being used for the electrically conductive layer preferably has a high selectivity for such etching steps. A suitable material that may be included in the material forming the electrically conductive layer is chromium (Cr). An advantage of using Cr is that it can be deposited in the same way as Ti, so that it can be applied without substantial amount of additional effort or difficulty.

In an embodiment the invention relates to a method of manufacturing a converter element for selectively converting impinging charged particles into photons. The method comprises: providing a substrate comprising a conversion material for converting charged particles into photons; subsequently coating the substrate with a first layer comprising an electrically conductive material, a second layer comprising an etch stop material and a third layer comprising a third material; providing a resist layer on top of said third layer; patterning, and developing the resist layer so as to form a first predetermined pattern, and etching the developed resist layer until the third layer is exposed; coating the exposed third layer with a fourth layer comprising a further etch stop material; lifting of the developed resist such that the third layer is exposed in accordance with a second predetermined pattern, the second predetermined pattern being an inversion of the first predetermined pattern; etching the third layer in accordance with the second predetermined pattern until the second layer is exposed; etching the fourth layer as well as the second layer in accordance with the second predetermined pattern until the first layer is exposed.

BRIEF DESCRIPTION OF THE DRAWINGS

The features and advantages of the invention will be appreciated upon reference to the following drawings, in which.

DESCRIPTION OF ILLUSTRATIVE EMBODIMENTS

The following is a description of certain embodiments of the invention, given by way of example only and with reference to the drawings.

Figure 1:
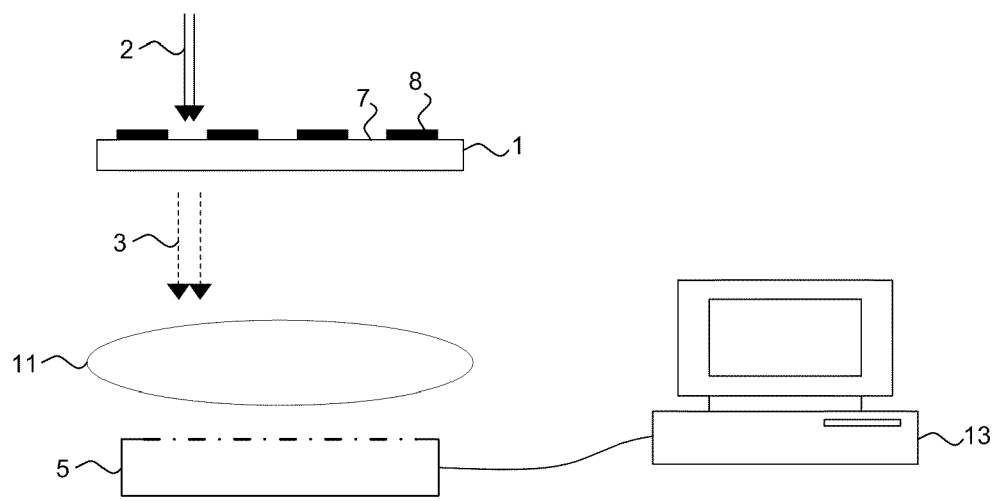
FIG. 1 schematically shows the concept of a sensor using a substrate converting charged particles into photons.

FIG. 1 schematically shows the operation of a sensor for determining one or more characteristics of particle beams, in particular one or more characteristics of charged particle beamlets. The sensor comprises a converter element 1 and a photon receptor 5. The converter element is provided with a pattern comprising charged particle blocking regions 8 and charged particle transmissive regions 7, further referred to as non-blocking regions. The converter element 1 is arranged for receiving charged particles 2 and generating photons 3 in response. The photons 3 may be directed towards the photon receptor 5 by means of an optical system 11. The photon receptor 5 is communicatively coupled to a calculation unit, e.g. a computer 13 for determining one or more characteristics of the charged particles 2.

The converter element 1 may take the form of a fluorescent element, for example a fluorescent screen, or a scintillating element, for example a substrate of a doped yttrium aluminum garnet (YAG) material. Hereafter, embodiments of the invention will be described in with a YAG-screen being used as converter element 1, where the YAG-screen may be referred to as YAG 1.

The photon receptor 5 may include any suitable light sensitive detector, such as a plurality of diodes, charged coupled device (CCD) cameras or complementary metal-oxide semiconductor (CMOS) cameras. Hereafter, the photon receptor 5 may be referred to as camera 5.

Additionally, although embodiments of the invention may be used for any type of (charged) particles or light beams 2, hereafter, embodiments of the invention will be discussed with reference to electrons.

In electron beamlet devices where the beamlet size is in the nanometer range, for example electron microscopes, electron beam lithography apparatus, and electron beam pattern generators, direct observation of photons created by conversion by the converter element 1 is insufficient to enable determination of characteristics such as position of an electron beamlet as the resolution is limited by the wavelength of the converter element 1.

To improve accuracy, an electron beamlet may be scanned across an electron blocking structure provided with sharp edges, further referred to as knife edges. An example of a sensor using a converter element provided with a knife edge is described in patent application US 2007/057204.

Figure 2A:
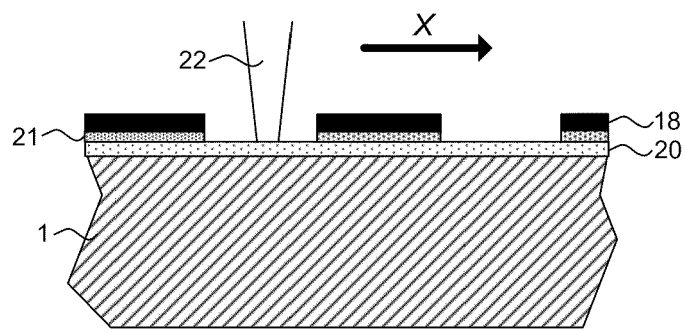
FIG. 2A schematically shows a cross-section of a converter element provided with a blocking structure.

FIG. 2A schematically shows a cross-section of a YAG 1 comprising an electron beamlet receiving surface provided with an electron blocking structure. The electron blocking structure comprises electron blocking regions provided with a layer 18 capable of blocking electrons. The blocking layer 18 may be a metal layer. A suitable metal for blocking electrons is tungsten. In between the blocking regions are non-blocking regions. An electron beam 22 impinging onto a non-blocking region of the electron blocking structure actually impinges onto the surface of the YAG 1 or a coating on the surface of the YAG.

Within the portions for blocking electrons, besides the blocking layer 18 an additional layer 21 is present. The additional layer 21 serves the purpose of increasing the uniformity of the blocking layer 18. The additional layer 21 may be a metal layer. An example of a particularly suitable material for use in the additional layer 21 is chromium.

The YAG 1 may be coated with a coating layer 20. The coating layer 20 may be a metal layer for blocking background radiation. The coating layer 20 is substantially permeable to charged particles on the one hand, while being substantially impermeable for ambient light on the other hand. For this reason, the thickness of the coating layer 20 is sufficient to establish both functions. Suitable materials for the coating layer 20 include aluminum and titanium.

As mentioned earlier, in order to determine one or more characteristics of an electron beam 22, the electron beam 22 may be scanned over a blocking structure provided on the YAG 1 (in FIG. 2A in a direction denoted as X-direction). In response, photons generated within the YAG 1 may be detected by a camera. An exemplary result of such scanning and detection action is schematically depicted in FIG. 2B.

Figure 2B:
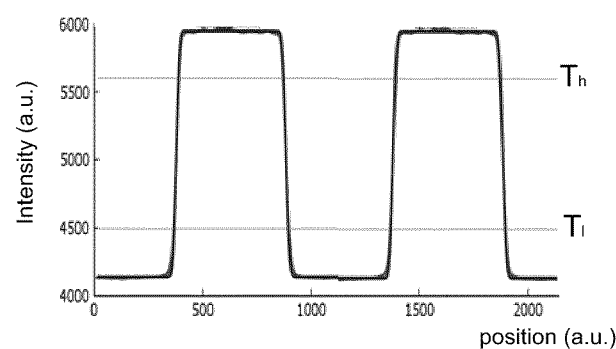
FIG. 2B represents a graph showing the transmitted intensity as a function of position for the blocking structure of FIG. 2A.
Figure 2C:
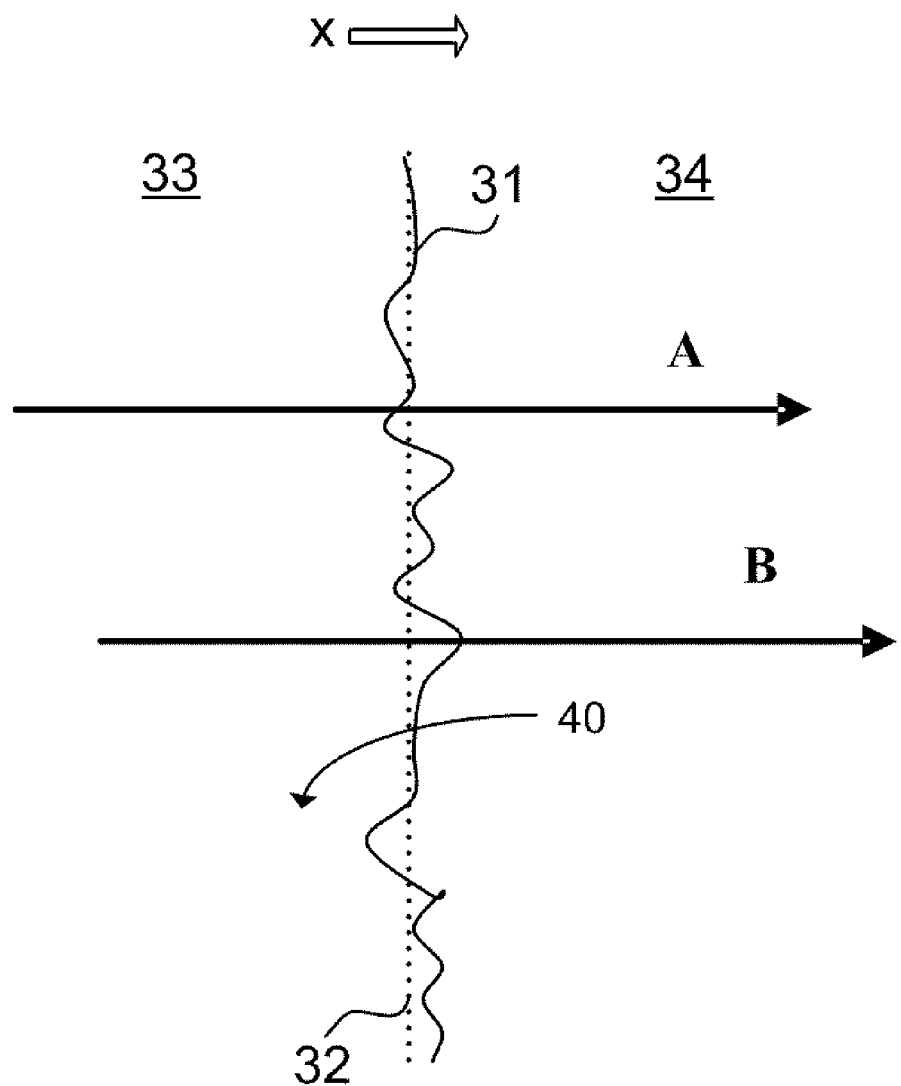
FIG. 2C schematically shows a problem related to line edge roughness.

FIG. 2B shows a graph representing intensity of light emitted by a converter element 1 as a function of x-position of an electron beam 22 over the surface of the converter element 1. A maximum response is observed when electron beam 22 is entirely positioned in a non-blocking region, and minimal light is generated if the electron beam 22 is positioned entirely on top of a blocking region. The crossing of a knife edge results in a steep change of light intensity.

In some embodiments, in order to provide a robust processing of measurement results, intensity levels exceeding a higher threshold value $T_h$, are provided as high level signal values to a processor. Similarly, detected intensity levels below a lower threshold value $T_l$ may be provided as low level signal values. The use of threshold values $T_h$, $T_l$ may enable the use of digital processing.

Upon scanning an electron beam in a predetermined direction, the electron beamlet may encounter two types of situations while crossing a knife edge. In a first situation, the beamlet experiences a transition from a blocking region to a non-blocking region. In a second situation, the beamlet experiences a transition from a non-blocking region to a blocking region.

Knife edges being encountered during a transition that corresponds to the first situation may be referred to as knife edges of a first type. Similarly, knife edges being encountered during a transition that corresponds to the second situation may be referred to as knife edges of a second type. The type of knife edge is thus dependent on the scanning direction of the beamlet to be measured. If reference is made to "knife edges of similar type", this means that all the knife edges involved either relate to knife edges of the first type or relate to knife edges of the second type.

Knowledge of the knife edge pattern provided on the electron-receiving surface of the converter element surface allows for the determination of one or more characteristics of a beamlet. Characteristics that can be measured by using a sensor as described with reference to FIG. 1, and a knife edge pattern as described with reference to FIG. 2A, include beamlet position and beamlet spot size, where the spot size relates to the size of the electron beamlet on the surface of the converter element 1.

For example, beamlet position can be measured by scanning the beamlet across the surface of the converter element in the x-direction and measuring the position at which the intensity of light emitted by a converter element changes from a maximum to a minimum value or from a minimum to a maximum value, as shown in FIG. 2B. For example, when the intensity changes from maximum to minimum value, this indicates that the beamlet is scanned over a knife edge transitioning from a non-blocking region to a blocking region in the x direction. However, there may be uncertainty as to which knife edge the beamlet is located at.

The size of the beamlet can be determined, for example, by measuring the distance between the point at which the intensity begins to decrease from a maximum value and the point at which the intensity reaches a minimum value as the beamlet is scanned across a knife edge. This indicates the distance over which the beamlet is partly blocked and partly un-blocked. Similarly, the beamlet size can be determined by measuring the time between sensing a maximum intensity and sensing a minimum intensity as the beamlet is scanned across a knife edge, and multiplying by the scanning speed of the beamlet. These measurements can also be performed on the opposite knife edge, the beamlet moving from minimum to maximum intensity.

Note that the measurement shown in FIG. 2B, and the discussion of beamlet position and beamlet size measurements relates to a beamlet having dimensions that are smaller than the widths of the blocking and non-blocking regions involved. These dimensions and widths are preferably taken along a direction parallel to the scan direction being used.

In many applications, a single knife edge is not suitable to obtain beamlet characteristics with sufficient accuracy. In particular so-called line edge roughness (LER) of a knife edge may limit the accuracy of beamlet measurements. FIG. 2D schematically illustrates a problem related to LER. In FIG. 2D, a sensor is arranged to detect the intensity of a beamlet being moved across a knife edge 31 separating an electron blocking region 33 and an electron non-blocking region 34. The knife edge 31 is designed to have the orientation and shape as denoted by the dotted line 32.

If the x-position of the beamlet is detected under the assumption that it follows a trajectory A across the knife edge 31 from the blocking region 33 towards the non-blocking region 34, while in reality the trajectory B is followed, the beamlet position in the scanning direction should be the same for both trajectories. After all, both trajectories cross the dotted line 32 at the same x-position. However, as can be readily seen in FIG. 2D, due to the line edge roughness of the knife edge 31, the measured x-position of the beamlet for trajectory A will be different than the measured x-position for trajectory B. In this example, determining the x-position based on the crossing of single knife edge 31 provides an inaccurate result.

FIGS. 3A-3H schematically show different stages of a method of manufacturing a converter element, for example a converter element as discussed with reference to FIG. 2A. The converter element is arranged for selectively converting impinging charged particles into photons.

Figure 3A:
FIGS. 3A-3H schematically show different stages of a method of manufacturing a converter element.

First, as shown in FIG. 3A, a substrate 101 is provided for supporting further layers of the sensor. Throughout this description the combination of the substrate 101 and the structures applied thereon is referred to as converter element. The substrate 101 comprises a conversion material for converting charged particles into photons. Such conversion material may be a scintillating material. In particular for applications where electrons are used as charged particles, a suitable scintillating material may be a material comprising an yttrium aluminum garnet (YAG).

Figure 3B:
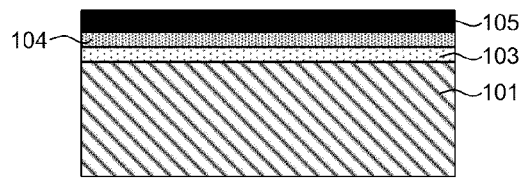

Subsequently, as shown in FIG. 3B, a surface side of the substrate 101 arranged for reception of charged particles is coated with one or more layers, typically being metal layers. The layers comprise a first layer 103 comprising an electrically conductive material. The first layer 103 is substantially impermeable for ambient light, that is the layer is arranged for blocking background radiation. Such background light blocking layer enhances quality of the sensor by preventing background light from interfering with the light generated by the converter element. The first layer 103 is further substantially permeable for charged particle beamlets. For this reason, the first layer 103 generally has a thickness within the range of about 30 to about 80 nm. Suitable materials for the first metal include titanium and aluminum, Ti being preferred as less prone to oxidizing over time and hence more conducive to maintaining lasting surface uniformity of said layer.

Additionally, the layers comprise a second layer 104 comprising a second material. The second material is an etch stop material that serves the purpose of stopping an etching process, preferably for both wet etching and dry etching processes. The use of the second layer can result in improved etching quality, in particular if the material has a high etch sensitivity. The second layer may be particularly useful for the realization of sharper edges. A suitable material for the second metal is chrome.

The layers further comprise a third layer 105 comprising a third material. The third material serves the purpose of blocking charged particle beamlets. A suitable material for the third material is a material that blocks charged particles as well as ambient light while having a layer of limited thickness. A suitable material is tungsten, in which case a suitable thickness would lie within the range of 50 to 500 nm. Such thickness is thick enough to sufficiently block incoming charged particles. On the other hand, such thickness has a negligible influence on effects like defocus and edge roughness.

Figure 3C:
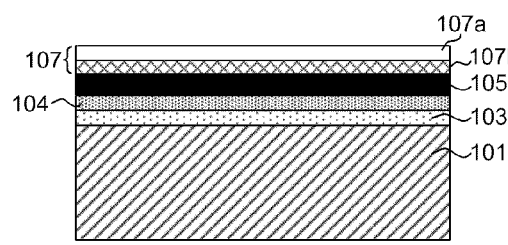

On top of the number of layers 103, 104, 105, a resist layer 107 is provided. As schematically shown in FIG. 3C, the resist layer 107 may be a single resist layer or, alternatively, a double resist layer comprising an upper layer 107a, and a lower layer 107b respectively. Further reference will be made to a single resist layer 107.

Figure 3D:
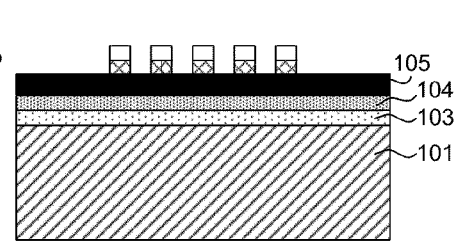

The resist layer 107 is then patterned in correspondence to a first predetermined pattern. After patterning, the resist layer 107 undergoes developing and etching steps in a fashion generally known in the art. The etching is performed until the third layer 105 is exposed. An exemplary end result of patterning, developing and etching the resist layer 107 is schematically shown in FIG. 3D.

Figure 3E:
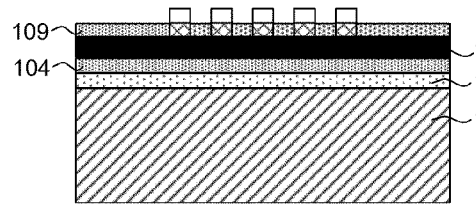

After etching, the exposed third layer 105 is coated with a fourth layer 109, for example by means of evaporation, as is schematically shown in FIG. 3E. Generally, the fourth layer 109 is a metal layer. The fourth layer 109 may serve as an etch stopping layer and may improve etching quality. The layer 109 may comprise the same material as used in the second layer 104, for example chrome.

Figure 3F:
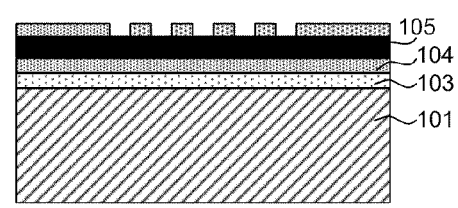

After deposition of the fourth layer 109, the developed resist is removed by lift off such that the third layer 105 is exposed in accordance with a second predetermined pattern, as schematically shown in FIG. 3F. The second predetermined pattern is an inversion of the first predetermined pattern.

Figure 3G:
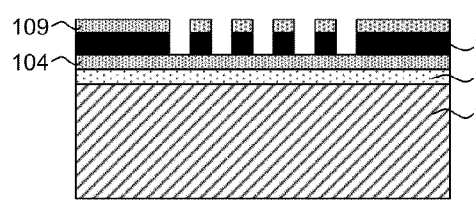

Subsequently, the exposed third layer 105 is etched in accordance with the second predetermined pattern until the second layer 104 is exposed. A schematic drawing of the converter element at this stage of the manufacturing process is shown in FIG. 3G.

Figure 3H:
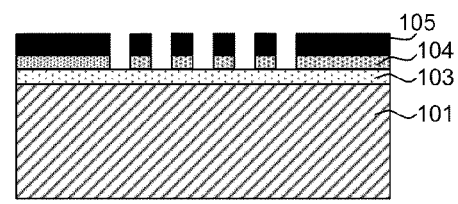

Finally, as schematically shown in FIG. 3H, the fourth layer 109 as well as the second layer 104 in accordance with the second predetermined pattern are removed, the latter one until the first layer 103 is exposed. Removal may be performed by techniques known in the art, for example etching.

The resulting converter element is similar to the converter element described with reference to FIG. 2A. When the method of FIGS. 3A-3H would be used to manufacture the converter element of FIG. 2A, substrate 1 and layers 18, 20, and 21 in FIG. 2A correspond to substrate 101 and layers 105, 103, and 104 respectively.

The invention has been described by reference to certain embodiments discussed above. It will be recognized that these embodiments are susceptible to various modifications and alternative forms well known to those of skill in the art. Further modifications in addition to those described above may be made to the structures and techniques described herein without departing from the spirit and scope of the invention. Accordingly, although specific embodiments have been described, these are examples only and are not limiting upon the scope of the invention, which is defined in the accompanying claims.

The invention claimed is:

1. Charged particle beamlet lithography system for transferring a pattern to a surface of a target comprising a sensor for determining one or more characteristics of one or more charged particle beamlets, the sensor comprising a converter element for receiving charged particles and generating photons in response, the converter element comprising a surface for receiving one or more charged particle beamlets, the surface being provided with one or more cells for evaluating one or more individual beamlets, each cell comprising a predetermined blocking pattern of one or more charged particle blocking structures forming multiple knife edges at transitions between blocking and non-blocking regions along a predetermined beamlet scan trajectory over the converter element surface, wherein the converter element surface is covered with a coating layer substantially permeable for said charged particles and substantially impermeable for ambient light, and an electrically conductive layer is located between the coating layer and the blocking structures.

2. System according to claim 1, wherein the sensor is adapted for determining one or more characteristics of a plurality of charged particle beamlets for each of the beamlets in parallel by simultaneously generating a signal in response receiving each of the plurality of charged particles beamlets.

3. System according to claim 1, wherein the conductive layer is substantially similar in shape and size as the dimensions of the blocking structures in a plane substantially parallel to the converter element surface.

4. System according to claim 1, wherein the conductive layer comprises chromium.

5. System according to claim 1, wherein the blocking structures comprise tungsten.

6. System according to claim 1, wherein the converter element comprises a scintillating material.

7. System according to claim 6, wherein the scintillating material comprises an yttrium aluminum garnet.

8. System according to claim 1, wherein the coating layer comprises titanium.

9. System according to claim 1, wherein the charged particle beamlets are electron beamlets.

10. System according to claim 1, wherein the sensor further comprises:
   a photon receptor for receiving photons generated by said converter element; and
   a control unit for receiving signals from the photon receptor and for determining one or more characteristics of one or more beamlets based on said signals.

11. System according to claim 1, further comprising:
   a beamlet generator for generating a plurality of charged particle beamlets;
   a modulation system for modulating the charged particle beamlets in accordance with a pattern to be transferred;
   an electron-optical system for focusing the modulated beamlets onto the surface of the target;
   a deflecting system for deflecting the focused beamlets over the surface of either the target or the sensor.

12. Sensor for generating a signal in response to exposure thereof by a charged particle beam, the sensor comprising a converter element for receiving charged particles and generating photons in response, the converter element comprising a surface for receiving one or more charged particle beamlets, the surface being provided with one or more cells for evaluating one or more individual beamlets, each cell comprising a predetermined blocking pattern of one or more charged particle blocking structures forming multiple knife edges at transitions between blocking and non-blocking regions along a predetermined beamlet scan trajectory over the converter element surface, wherein said converter surface is covered with a coating layer substantially permeable for said charged particles and substantially impermeable for ambient light, and an electrically conductive layer is located between the coating layer and the blocking structures, and wherein the sensor further comprises a photon receptor associated with the converter element for generating a signal on the basis of photons generated by the converter element.

13. Sensor according to claim 12, wherein the photon is arranged for forming reception information based on photons generated by the converter element, the sensor further comprising a control unit for receiving the reception information from the photon receptor and determining a characteristic of the plurality of charged particle beams based on the reception information.

14. Converter element for receiving charged particles and generating photons in response for use in a sensor for sensing a characteristic of a plurality of charged particles beamlets, the converter element comprising a surface for receiving one or more charged particle beamlets, the surface being provided with one or more cells for evaluating one or more individual beamlets, each cell comprising a predetermined blocking pattern of one or more charged particle blocking structures forming multiple knife edges at transitions between blocking and non-blocking regions along a predetermined beamlet scan trajectory over the converter element surface, wherein the converter element surface is covered with a coating layer substantially permeable for charged particles and substantially impermeable for ambient light, and an electrically conductive layer is located between the coating layer and the blocking structures.

15. Method of manufacturing a converter element arranged for selectively converting impinging charged particles into photons, the method comprising:
   providing a substrate comprising a conversion material for converting charged particles into photons;
   subsequently coating the substrate with a first layer comprising an electrically conductive material, a second layer comprising an etch stop material and a third layer comprising a third material;
   providing a resist layer on top of said third layer;
   patterning, and developing the resist layer so as to form a first predetermined pattern, and etching the developed resist layer until the third layer is exposed;
   coating the exposed third layer with a fourth layer comprising a further etch stop material;
   lifting of the developed resist such that the third layer is exposed in accordance with a second predetermined pattern, the second predetermined pattern being an inversion of the first predetermined pattern;
   etching the third layer in accordance with the second predetermined pattern until the second layer is exposed;
   etching the fourth layer as well as the second layer in accordance with the second predetermined pattern until the first layer is exposed.

16. The method according to claim 15, wherein said first layer is substantially impermeable for ambient light and substantially permeable for charged particle beamlets.

17. The method according to claim 15, wherein the etch stop material of the second layer and the further etch stop material of the fourth layer are the same.

18. The method according to claim 15, wherein at least one of the etch stop material and the further etch stop material comprises chrome.

19. The method according to claim 15, wherein the electrically conductive material of the first layer comprises at least one of titanium and aluminum.

20. The method according to claim 15, wherein the third layer material has a high selectivity to both wet and dry etching.

21. The method according to claim 15, wherein the third material comprises tungsten.

22. The method according to claim 15, wherein the conversion material of the substrate comprises a scintillating material.

23. The method according to claim 22, wherein the scintillating material comprises an yttrium aluminum garnet.

* * * * *

UNITED STATES PATENT AND TRADEMARK OFFICE
CERTIFICATE OF CORRECTION

PATENT NO. : 8,357,906 B2  
APPLICATION NO. : 13/053488  
DATED : January 22, 2013  
INVENTOR(S) : Rabah Hanfoug Page 1 of 1

It is certified that error appears in the above-identified patent and that said Letters Patent is hereby corrected as shown below:

Title Page, Item (73), Assignee "MAPPER LITHOPRAPHY IP B.V.." should be --MAPPER LITHOGRAPHY IP B.V.--

Signed and Sealed this  
Nineteenth Day of March, 2013

Teresa Stanek Rea  
*Acting Director of the United States Patent and Trademark Office*